(12) United States Patent
Schultz et al.

(10) Patent No.: US 7,687,339 B1
(45) Date of Patent: Mar. 30, 2010

(54) METHODS FOR FABRICATING FINFET STRUCTURES HAVING DIFFERENT CHANNEL LENGTHS

(75) Inventors: Richard Schultz, Fort Collins, CO (US); Frank Scott Johnson, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/365,303

(22) Filed: Feb. 4, 2009

(51) Int. Cl.
*H01L 21/336* (2006.01)
*H01L 21/8234* (2006.01)

(52) U.S. Cl. .................. 438/197; 438/157; 438/283; 438/587; 257/E27.099; 257/E29.13

(58) Field of Classification Search .............. 438/197, 438/157, 283, 587; 257/E27.099, E29.13
See application file for complete search history.

(56) References Cited

U.S. PATENT DOCUMENTS 7,301,210 B2 * 11/2007 Abadeer et al. ............ 257/401

2007/0249174 A1 * 10/2007 Yang ........................ 438/712

OTHER PUBLICATIONS

U.S. Appl. No. 12/412,722, filed Mar. 27, 2009, Schultz, et al.

* cited by examiner

*Primary Examiner*—Michelle Estrada
(74) *Attorney, Agent, or Firm*—Ingrassia Fisher & Lorenz, P.C.

(57) ABSTRACT

Methods for fabricating a FinFET structure are provided. One method comprises forming a hard mask layer on a gate-forming material layer having a first portion and a second portion. A plurality of mandrels are fabricated on the hard mask layer and overlying the first portion and the second portion of the gate-forming material layer. A sidewall spacer material layer is deposited overlying the plurality of mandrels. The sidewall spacer material layer overlying the first portion of the gate-forming material layer is partially etched. Sidewall spacers are fabricated from the sidewall spacer material layer, the sidewall spacers being adjacent sidewalls of the plurality of mandrels. The plurality of mandrels are removed, the hard mask layer is etched using the sidewall spacers as an etch mask, and the gate-forming material layer is etched using the etched hard mask layer as an etch mask.

18 Claims, 3 Drawing Sheets

METHODS FOR FABRICATING FINFET STRUCTURES HAVING DIFFERENT CHANNEL LENGTHS

FIELD OF THE INVENTION

The present invention generally relates to methods for fabricating semiconductor devices, and more particularly relates to methods for fabricating FinFET structures having different channel lengths.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures, and typically include two or more gate structures formed in parallel. One such semiconductor structure is the "FinFET," which takes its name from the multiple thin silicon "fins" that are used to form the respective gate channels, and which are typically on the order of tens of nanometers in width.

More particularly, referring to the exemplary prior art nonplanar FET structure shown in FIG. 1, a FinFET 100 generally includes two or more parallel silicon fin structures (or simply "fins") 104 and 106. These structures are typically formed on a silicon-on-insulator (SOI) substrate (not shown), with fins 104 and 106 extending between a common drain electrode and a common source electrode (not shown). A conductive gate structure 102 "wraps around" three sides of both fins 104 and 106, and is separated from the fins by a standard gate oxide layer 103. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, thus determines the effective channel length of the device.

FinFETs with smaller channel lengths and smaller gate pitch exhibit higher current drive strength and less capacitance, and can operate at higher frequency, thus providing overall increased device performance. However, as semiconductor structures approach the 22 nanometer (nm) and 15 nm technology nodes, FinFETs with small channel lengths may suffer from static current leakage, with the static current leakage increasing as the channel length decreases. In addition, current processes for fabricating such small channel length FinFETs often result in high channel length variability, which can adversely affect transistor performance. While certain transistors of a semiconductor device structure perform functions, such as critical timing, that require short channel lengths, not all transistors of the structure perform such functions. These transistors can be fabricated with wider channel lengths, thus overcoming leakage problems and fabrication variability. However, because of the very small tolerances involved, current methods for fabricating gate structures typically do not provide for the formation of gate structures with different widths and, thus, FinFET structures with different channel lengths.

Accordingly, it is desirable to provide methods for fabricating FinFET structures having gate structures of different widths. In addition, it is desirable to provide methods for simultaneously forming FinFET structures with varying channel lengths. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for fabricating FinFET gate structures having different widths are provided herein. In accordance with one exemplary embodiment, a method for fabricating a semiconductor structure comprises forming a hard mask layer on a gate-forming material layer having a first portion and a second portion. A plurality of mandrels are fabricated on the hard mask layer and overlying the first portion and the second portion of the gate-forming material layer. A sidewall spacer material layer is deposited overlying the plurality of mandrels. The sidewall spacer material layer overlying the first portion of the gate-forming material layer is partially etched. Sidewall spacers are fabricated from the sidewall spacer material layer, the sidewall spacers being adjacent sidewalls of the plurality of mandrels. The plurality of mandrels are removed, the hard mask layer is etched using the sidewall spacers as an etch mask, and the gate-forming material layer is etched using the etched hard mask layer as an etch mask.

In accordance with another exemplary embodiment of the present invention, a method for fabricating a semiconductor device structure comprises fabricating a plurality of mandrels on a hard mask layer formed on a gate-forming material layer. Each of the plurality of mandrels has sidewalls. A sidewall spacer material layer is deposited overlying the plurality of mandrels. A portion of the sidewall spacer material layer overlying a first portion of the gate-forming material layer is removed. The first portion of the gate-forming material layer is less than the entire gate-forming material layer. The sidewall spacer material layer is anisotropically etched to form sidewall spacers about the sidewalls of each of the plurality of mandrels. The step of anisotropically etching is performed after the step of removing a portion of the sidewall spacer material layer. The plurality of mandrels is removed, the hard mask layer is etched using the sidewall spacers as an etch mask, and the gate-forming material layer is etched using the etched hard mask layer as an etch mask.

In accordance with a further exemplary embodiment of the present invention, a method for fabricating a semiconductor device structure comprises fabricating mandrels on a hard mask layer formed on a gate-forming material layer, each of the mandrels having sidewalls. A sidewall spacer material layer is deposited overlying the mandrels and is anisotropically etched to form sidewall spacers about the sidewalls of the mandrels. A portion of the sidewall spacers that overlie a first portion of the gate-forming material layer is etched. The first portion is less than the entire gate-forming material layer. The mandrels are removed, the hard mask layer is etched using the sidewall spacers as an etch mask, and the gate-forming material layer is etched using the etched hard mask layer as an etch mask.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 2-10 illustrate, in cross section, methods for fabricating FinFET gate structures of different gate widths. The methods include the formation of sidewall spacers of different thickness to define gate structures of the FinFET structures. By depositing sidewall spacer material of a uniform thickness and subsequently refining that thickness in regions where gate structures of smaller width are desired, sidewall spacers of smaller and larger thickness can be fabricated and subsequently used as an etch mask so that gate structures of smaller and larger widths can be formed simultaneously. In this regard, as different photoresist masks are not used to define the gate structures having different widths, less variability among the minimum channel lengths of the resulting FinFET structures and better gate structure alignment can be achieved. In addition, as gate structures with larger widths can be fabricated along with small-width gate structures needed for critical timing paths, static leakage and power consumption of the resulting semiconductor structure can be decreased.

Figure 2:
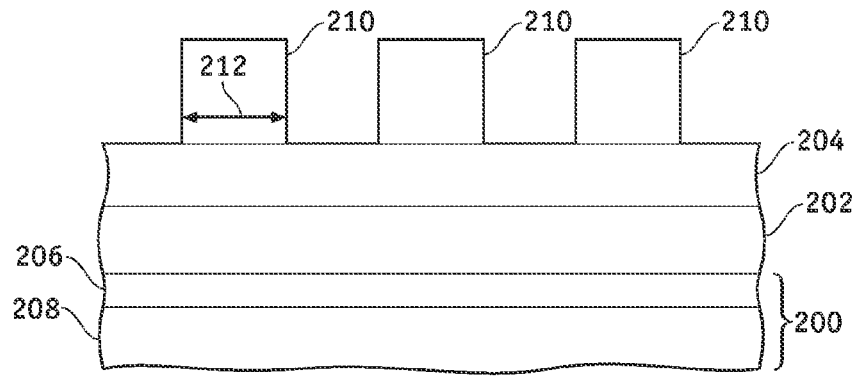
FIGS. 2-9 illustrate, in cross section, methods for fabricating gate structures of FinFET structures having different widths, in accordance with exemplary embodiments of the present invention.

Referring to FIG. 2, in accordance with an exemplary embodiment of the present invention, a method for fabricating FinFET gate structures includes the step of forming a hard mask layer 204 on a gate-forming material layer 202. The gate-forming material is deposited as a blanket layer overlying one or more previously fabricated, silicon-comprising fins (not shown). The fins are formed on a semiconductor substrate. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may comprise a buried oxide layer 206 disposed on a support substrate 208. Support substrate 208 is preferably a silicon substrate, which can be either N-type or P-type silicon. Here, the silicon-comprising material from which the fins are formed and buried oxide layer 206 form what is commonly known as a silicon-on-insulator (SOI) structure that, in turn, is supported by support substrate 208.

The gate-forming material layer 202 comprises a conductive material, such as, for example, polycrystalline silicon, one or more metals, or a combination thereof, and has a thickness suitable for a desired device application. Hard mask layer 204 comprises any suitable mask material that exhibits a lower etch rate than the gate-forming material layer 202 when subjected to the same etch chemistry. In this regard, adequate control of the gate-forming etch process, discussed in more detail below, can be achieved. The hard mask layer can be, for example, a layer of silicon nitride. The silicon nitride can be deposited, for example, by LPCVD by the reaction of dichlorosilane and ammonia.

A plurality of mandrels 210 are formed on hard mask layer 204. In one exemplary embodiment, the mandrels are formed with uniform width, indicated by double-headed arrow 212. The mandrels are formed by depositing a layer of mandrel-forming material on the hard mask layer 204. The mandrel-forming material comprises a material having a composition different from that of the hard mask layer 204 so as to achieve high mandrel-to-hard mask layer selectivity. Examples of suitable materials for the mandrel-forming material include, but are not limited to, photoresist, polycrystalline silicon, silicon oxide, silicon nitride, and the like. In a preferred embodiment, the mandrel-forming material comprises polycrystalline silicon. As discussed in more detail below, the height of the mandrels is determined, in part, on the desired or contemplated channel length and, hence, the gate width of the subsequently-formed gate structures. After deposition of the layer of mandrel-forming material, a patterned mask (not shown), such as a patterned photoresist, is formed on the mandrel-forming material, which then is etched to form the mandrels 210. The patterned mask is removed after etching the mandrels.

Figure 3:
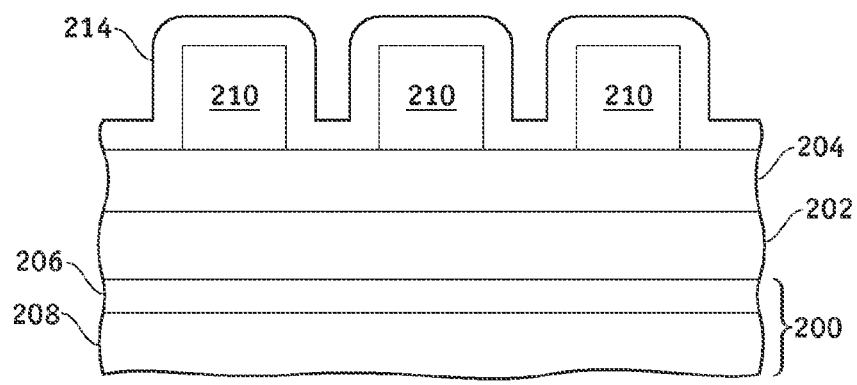

After formation of mandrels 210, a sidewall spacer material layer 214 is uniformly and conformably deposited overlying the mandrels 210, as illustrated in FIG. 3. The sidewall spacer material layer 214 comprises a material having a composition different from that of the mandrel-forming material and hard mask layer to achieve high mandrel-to-spacer etch selectivity. Materials suitable for sidewall spacer material layer 214 include, for example, silicon nitride and silicon oxide. Preferably, the sidewall spacer material comprises a silicon oxide. Sidewall spacers subsequently formed from the sidewall spacer material layer 214 serve to define the dimensions of subsequently-fabricated gate structures and, hence, the channel lengths of corresponding FinFET structures. In this regard, the sidewall spacer material layer 214 is deposited to a thickness that, along with the height of the mandrels 210 and the sidewall spacer-forming etch process parameters, forms sidewall spacers with widths that correspond to the width of the widest gate structure to be fabricated. Methods for defining sidewall spacer widths are well known in the art and, thus, will not be discussed further herein.

Figure 4:
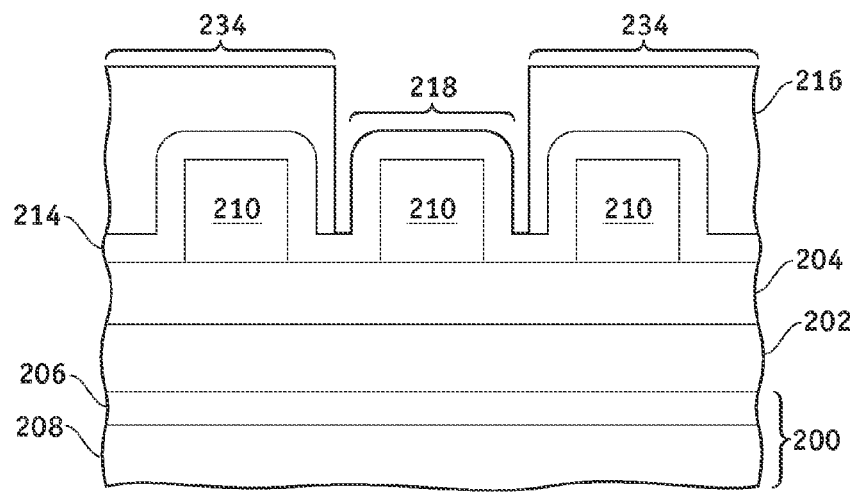
Figure 5:
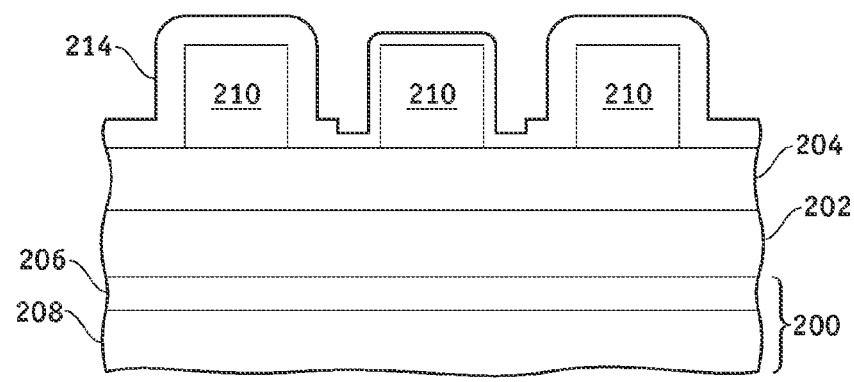
Figure 6:
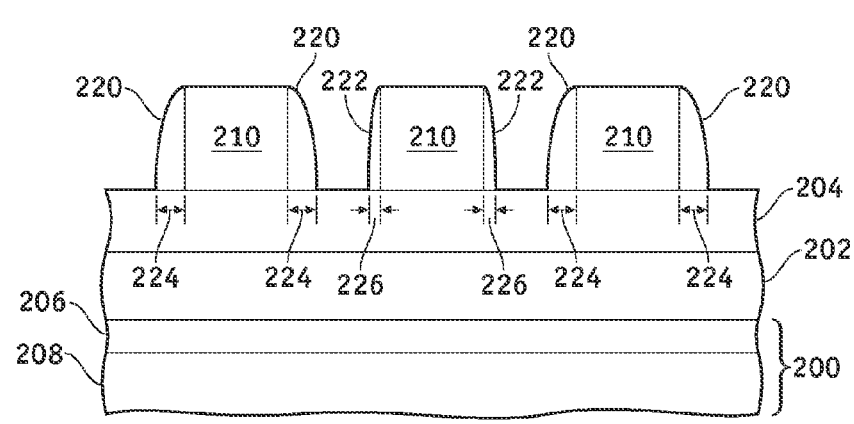

Referring to FIG. 4, in one exemplary embodiment of the present invention, after deposition of the sidewall spacer material layer 214, a mask 216 is formed overlying the sidewall spacer material layer 214 and is patterned so that the mask is removed from the sidewall spacer material layer 214 that overlies a first portion 218 of the gate-forming material layer 202 and remains overlying a second portion 234 of the gate-forming material layer 202. The mask can comprise, for example, photoresist. The exposed sidewall spacer material layer 214 then is partially etched, as illustrated in FIG. 5, so that the exposed sidewall spacer material layer 214 has a thickness corresponding to a width of the second widest gate structure to be fabricated. The mask 216 then is removed. Referring to FIG. 6, a blanket anisotropic etch then is performed to obtain a first set of spacers 220, each having a "base width," that is, a width closest to the hard mask layer 204, indicated by double-headed arrow 224, that corresponds to the desired width of the widest gate structures and a second set of spacers 222, each having a base width, indicated by double-headed arrows 226, that corresponds to the desired width of the second widest gate structures. As the fabrication of gate structures of only two widths is illustrated in FIGS. 2-9, the second widest gate structure is also the thinnest gate structure. However, it will be appreciated that the invention is not so limited and gate structures of three, four and more widths can be fabricated. Accordingly, the steps of forming patterned mask 216 and partially etching sidewall spacer material layer 214 can be repeated multiple times to obtain sidewall spacers of multiple widths.

Figure 10:
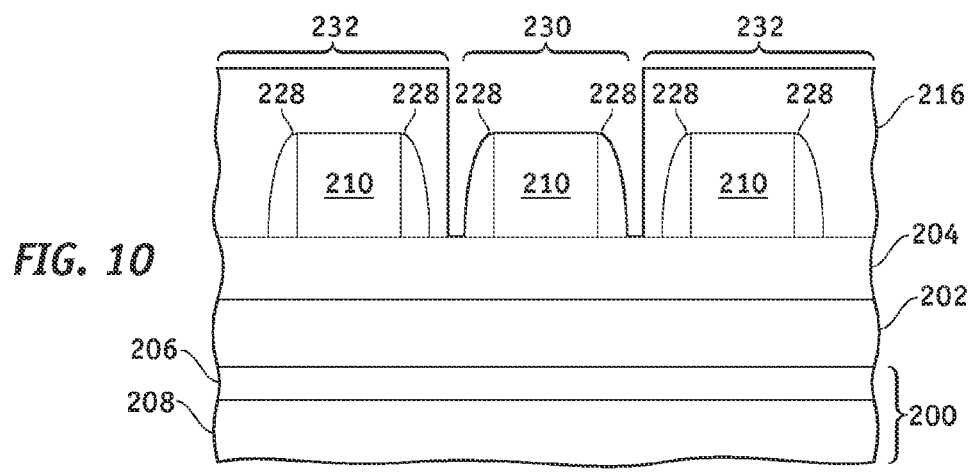
FIG. 10, in association with FIGS. 2-4 and 6-9, illustrates, in cross section, methods for fabricating gate structures of FinFET structures having different widths, in accordance with another exemplary embodiment of the present invention.

Referring momentarily to FIG. 10, in an alternative embodiment, after deposition of the sidewall spacer material layer 214 as illustrated in FIG. 4, a blanket anisotropic etch is performed to obtain sidewall spacers 228 of uniform base width. Mask 216 then is formed overlying the mandrels 210 and sidewall spacers 228 and is patterned so that the mask is removed from a first portion 230 of the gate-forming material layer 202 but remains on a second portion 232 of the gate-forming material layer 202. The exposed sidewall spacers 228 then are further partially etched to obtain sidewall spacers 222 having base widths that correspond to the desired width of the second widest gate structures and sidewall spacers 220 having base widths that correspond to the desired width of the widest gate structures, as illustrated in FIG. 6. The mask 216 then is removed. Again, as the fabrication of gate structures of only two widths is illustrated in the figures, the second widest gate structure is also the thinnest gate structure. However, it will be appreciated that the invention is not so limited. Accordingly, the steps of forming uniform sidewall spacers, forming a patterned mask, and partially etching the sidewall spacers can be repeated multiple times to obtain sidewall spacers of multiple widths.

Figure 1:
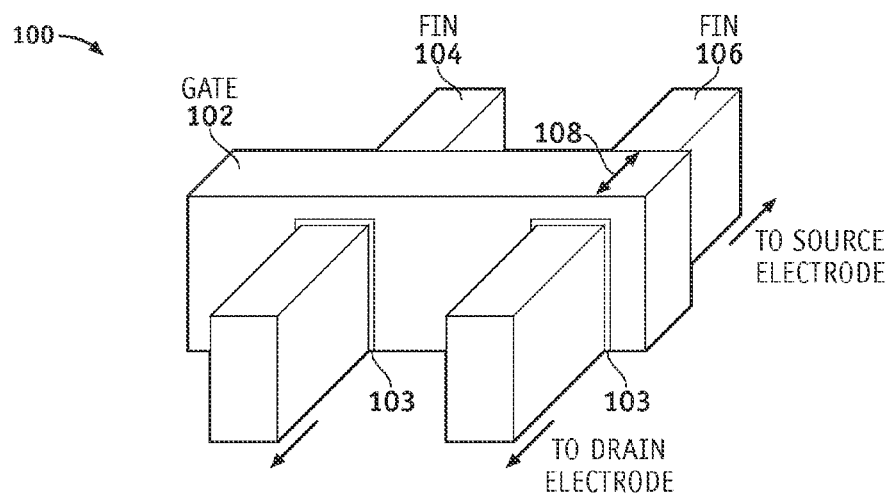
FIG. 1 is an isometric schematic view of a FinFET structure available in the prior art.
Figure 7:
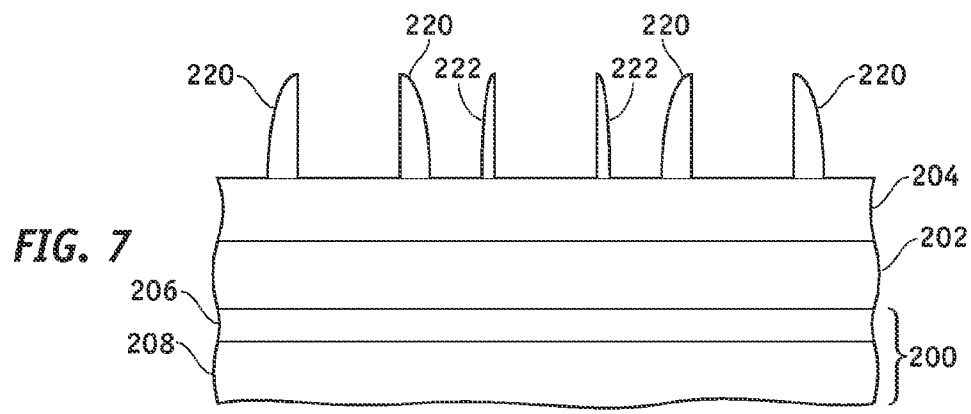
Figure 8:
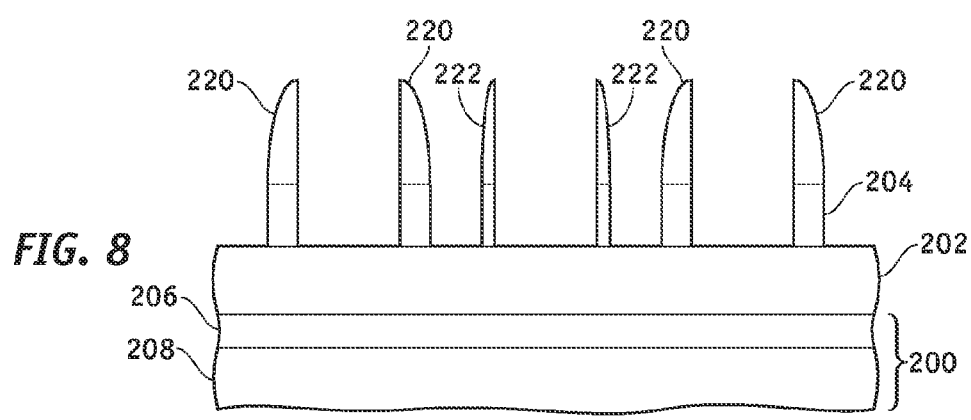
Figure 9:
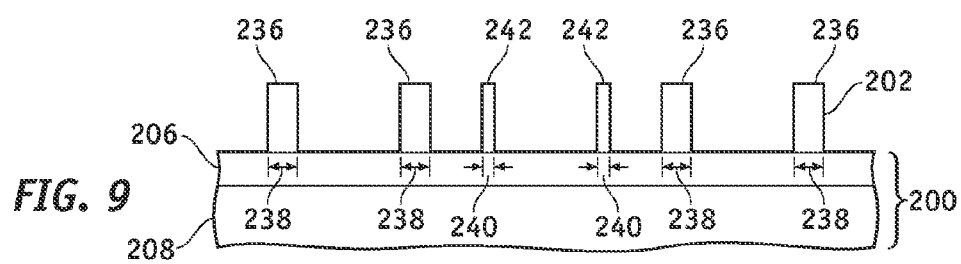

Referring to FIG. 7, after formation of the sidewall spacers 220 and 222, the mandrels are removed using an etch chemistry suitable for etching the mandrels while leaving the sidewall spacers in tact. Using the sidewall spacers 220 and 222 as an etch mask, the hard mask layer 204 is etched, as illustrated in FIG. 8. In one exemplary embodiment, the sidewall spacers 220 and 222 then are removed from the etched hard mask layer 204 such that the aspect ratio of etched hard mask layer 204 will be less than the aspect ratio of the sidewall spacers and the etched hard mask layer 204 combined. In this regard, maximum control of the subsequent etching of the gate-forming material layer 202 can be achieved so as to accurately transfer the width of the hard mask layer to the gate structures. Next, as illustrated in FIG. 9, the etched hard mask layer 204 is used as an etch mask during the etching of the gate-forming material 202 to form gate structures 236 and 242 having widths 238 and 240 that are substantially equal to widths 224 and 226 of sidewall spacers 220 and 222 of FIG. 6, respectively. The etched hard mask layer 204 then is removed and, thereafter, any number of known process steps can be performed to complete fabrication of FinFET structures, such as that depicted in FIG. 1.

Accordingly, methods for fabricating FinFET gate structures of different widths and, hence, FinFET structures with different channel lengths have been provided. In this regard, as different photoresist masks are not used to define the gate structures having different widths, less variability among the minimum channel lengths of the FinFET structures and better gate structure alignment can be achieved. In addition, as gate structures with larger widths can be fabricated along with smaller-width gate structures needed for critical timing paths, static leakage and power consumption of the resulting semiconductor structure can be decreased.

While at least one exemplary embodiment has been presented in the foregoing detailed description of the invention, it should be appreciated that a vast number of variations exist. For example, while the fabrication of gate structures with only two different widths were described, it will be appreciated that, once the sidewall spacer material layer is deposited, multiple masking and etch processes can be performed to form sidewall spacers having a variety of base widths. In this regard, gate structures of varying width and, hence, FinFET structures of varying channel length can be fabricated. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor structure, the method comprising the steps of:
   forming a hard mask layer on a gate-forming material layer having a first portion and a second portion;
   fabricating a plurality of mandrels on the hard mask layer and overlying the first portion and the second portion of the gate-forming material layer;
   depositing a sidewall spacer material layer overlying the plurality of mandrels;
   partially etching the sidewall spacer material layer overlying the first portion of the gate-forming material layer, the first portion being less than the entire gate-forming material layer;
   fabricating sidewall spacers from the sidewall spacer material layer, the sidewall spacers adjacent sidewalls of the plurality of mandrels;
   removing the plurality of mandrels;
   etching the hard mask layer using the sidewall spacers as an etch mask; and
   etching the gate-forming material layer using the etched hard mask layer as an etch mask.

2. The method of claim 1, wherein the step of partially etching the sidewall spacer material layer comprises the steps of:
   forming a mask on the sidewall spacer material layer overlying the plurality of mandrels;
   removing a portion of the mask that overlies the first portion of the gate-forming material layer with the mask remaining overlying the second portion of the gate-forming material layer; and
   partially etching the sidewall spacer material layer overlying the first portion of the gate-forming material layer.

3. The method of claim 1, wherein the step of fabricating sidewall spacers from the sidewall spacer material layer comprises subjecting the sidewall spacer material layer to an anisotropic etch.

4. The method of claim 1, wherein the step of fabricating sidewall spacers is performed before the step of partially etching the sidewall spacer material layer and wherein the step of fabricating sidewall spacers comprises fabricating sidewall spacers from the sidewall spacer material layer overlying the first and the second portion of the gate-forming material layer.

5. The method of claim 1, further comprising the step of removing the sidewall spacers after the step of etching the hard mask layer and before the step of etching the gate-forming material layer.

6. The method of claim 1, wherein the step of fabricating a plurality of mandrels comprises the steps of:
   depositing a mandrel-forming material overlying the hard mask layer;
   forming a patterned mask on the mandrel-forming material; and
   etching the mandrel-forming material.

7. The method of claim 1, wherein the step of fabricating sidewall spacers comprises fabricating first sidewall spacers, each having a first base width, and second sidewall spacers, each having a second base width, the first base width being greater than the second base width.

8. The method of claim 7, wherein the step of etching the gate-forming material layer comprises forming first gate structures, each having a width substantially equal to the first base width, and second gate structures, each having a width substantially equal to the second base width.

9. A method for fabricating a semiconductor device structure, the method comprising the steps of:
fabricating a plurality of mandrels on a hard mask layer formed on a gate-forming material layer, each of the plurality of mandrels having sidewalls;
depositing a sidewall spacer material layer overlying the plurality of mandrels;
removing a portion of the sidewall spacer material layer overlying a first portion of the gate-forming material layer, wherein the first portion of the gate-forming material layer is less than the entire gate-forming material layer;
anisotropically etching the sidewall spacer material layer to form sidewall spacers about the sidewalls of each of the plurality of mandrels, the step of anisotropically etching performed after the step of removing a portion of the sidewall spacer material layer;
removing the plurality of mandrels;
etching the hard mask layer using the sidewall spacers as an etch mask; and
etching the gate-forming material layer using the etched hard mask layer as an etch mask.

10. The method of claim 9, wherein the step of fabricating a plurality of mandrels comprises the steps of:
depositing a mandrel-forming material overlying the hard mask layer;
forming a patterned mask on the mandrel-forming material; and
etching the mandrel-forming material.

11. The method of claim 9, further comprising the step of removing the sidewall spacers after the step of etching the hard mask layer and before the step of etching the gate-forming material layer.

12. The method of claim 9, wherein the step of anisotropically etching comprises fabricating first sidewall spacers, each having a first base width, and second sidewall spacers, each having a second base width, the first base width being greater than the second base width.

13. The method of claim 12, wherein the step of etching the gate-forming material layer comprises forming first gate structures, each having a width substantially equal to the first base width, and second gate structures, each having a width substantially equal to the second base width.

14. A method for fabricating a semiconductor device structure, the method comprising the steps of:
fabricating mandrels on a hard mask layer formed on a gate-forming material layer, each of the mandrels having sidewalls;
depositing a sidewall spacer material layer overlying the mandrels;
anisotropically etching the sidewall spacer material layer to form sidewall spacers on the sidewalls of the mandrels;
etching a portion of the sidewall spacers that overlie a first portion of the gate-forming material layer, the first portion being less than the entire gate-forming material layer;
removing the mandrels;
etching the hard mask layer using the sidewall spacers as an etch mask; and
etching the gate-forming material layer using the etched hard mask layer as an etch mask.

15. The method of claim 14, wherein the step of fabricating mandrels comprises the steps of:
depositing a mandrel-forming material overlying the hard mask layer;
forming a patterned mask on the mandrel-forming material; and
etching the mandrel-forming material.

16. The method of claim 14, further comprising the step of removing the sidewall spacers after the step of etching the hard mask layer and before the step of etching the gate-forming material layer.

17. The method of claim 14, wherein the step of etching a portion of the sidewall spacers results in first sidewall spacers, each having a first base width, and second sidewall spacers, each having a second base width, the first base width being greater than the second base width.

18. The method of claim 17, wherein the step of etching the gate-forming material layer comprises forming first gate structures, each having a width substantially equal to the first base width, and second gate structures, each having a width substantially equal to the second base width.

* * * * *